(12) United States Patent
Ohta et al.

(10) Patent No.: US 7,390,990 B2
(45) Date of Patent: Jun. 24, 2008

(54) HEATING DEVICE

(75) Inventors: Mitsuru Ohta, Inazawa (JP); Masao Nishioka, Tokoname (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/689,654

(22) Filed: Mar. 22, 2007

(65) Prior Publication Data

US 2007/0221649 A1   Sep. 27, 2007

(30) Foreign Application Priority Data

Mar. 24, 2006   (JP) ............................. 2006-084106

(51) Int. Cl.
*F27D 11/00* (2006.01)
*H05B 3/68* (2006.01)
(52) U.S. Cl. .................. 219/385; 219/443.1; 219/444.1
(58) Field of Classification Search .................. 219/385, 219/443.1, 444.1, 447, 448, 452; 118/725, 118/728
See application file for complete search history.

(56) References Cited

U.S. PATENT DOCUMENTS 6,645,304 B2   11/2003   Yamaguchi
6,753,507 B2 *  6/2004   Fure et al. .................... 118/728
7,241,346 B2 *  7/2007   Hanamachi et al. ......... 118/725
2005/0014628 A1  1/2005  Yoshikawa et al.

FOREIGN PATENT DOCUMENTS

JP   2002-134590 A1   5/2002
JP   2005-041765 A1   2/2005

* cited by examiner

*Primary Examiner*—Tu Hoang
*Assistant Examiner*—Vinod D Patel
(74) *Attorney, Agent, or Firm*—Burr & Brown

(57) ABSTRACT

A heating device is provided, including an insulating ceramic base having a heating surface for heating an object. A high frequency electrode is embedded in the insulating ceramic base in the vicinity of the heating surface, and a heating body is embedded in the base in a location that is further from the heating surface than the location of the high frequency electrode. A low resistance ceramic member is provided so as to be exposed to a part of the heating surface of the insulating ceramic base and to be connected to a conductive member inside of the insulating ceramic base. A main component of the material of the low resistance ceramic member is common to that of the insulating ceramic base, and the respective thermal expansion coefficients are equivalent.

5 Claims, 2 Drawing Sheets

HEATING DEVICE

CROSS REFERENCE TO RELATED APPLICATIONS

This application is based upon and claims the benefit of priority from Patent Application No. 2006-84106 filed on Mar. 24, 2006 in the Japanese Patent Office, of which contents are incorporated herein by reference.

BACKGROUND OF THE INVENTION

1. Field of the Invention

The present invention relates to a heating device for use in heating a semiconductor wafer and the like.

2. Description of the Related Art

In a manufacturing process of a semiconductor device, a heating treatment is implemented in order to form an oxidation film and the like on a wafer by using a semiconductor manufacturing apparatus. As an example of a heating device for implementing the heating treatment in the semiconductor manufacturing apparatus, there is a ceramic heater including a disc-like ceramic base having a heating surface on which a heating object is set, in which a linear resistance heating body is embedded in the ceramic base. One or plural lines of the linear resistance heating bodies of the ceramic heater are embedded in a wiring pattern parallel to the heating surface of the ceramic base. A voltage is applied to both ends of the lines, and the heating surface is thereby made to generate heat.

Moreover, in the ceramic heater, there is one in which a disc-like high frequency electrode capable of applying a high frequency is embedded in an inside of the ceramic base in the vicinity of the heating surface. The high frequency electrode constructs a pair of plasma electrodes, for example, together with an opposite electrode disposed adjacent to the heating surface oppositely thereto in a space above the ceramic base. Electric power is supplied to the high frequency electrode and the opposite electrode, thus making it possible to generate high frequency plasma in a space in the vicinity of the heating object set on the heating surface. Moreover, the high frequency electrode can also be used for applying a bias voltage to the heating object.

As a material used for the ceramic base of the ceramic heater, a material having sufficiently high electrical resistivity or having insulating property against such a resistance heating element at an operation temperature at which the treatment object is heated. The reason is as follows. Specifically, when the material of the ceramic body has conductivity, a part of a current supplied in order to heat the resistance heating body flows through the ceramic base. Then, a region other than the resistance heating body generates heat, or a desired current does not flow through the resistance heating body. As a result, the resistance heating body is inhibited from performing uniform heating all over the heating surface, that is, uniform heating performance of the ceramic body is significantly damaged.

Therefore, as the material of the base of the ceramic heater, aluminum nitride (AlN) is frequently used. Aluminum nitride is good in heat resistance and corrosion resistance, has high thermal conductivity and high resistivity. In terms of these characteristics, aluminum nitride is suitable for the base of the ceramic heater.

With regard to a sintered body using aluminum nitride as described above, there is an aluminum nitride sintered body mixed with carbon fiber in order to obtain volume resistivity suitable for use as an electrostatic chuck (Japanese Patent Laid-Open Publication No. 2005-41765).

Moreover, with regard to a susceptor having low volume resistivity, there is a ceramic-made susceptor having a stacked two-layer structure of a surface layer having a mounting surface on which the treatment object is mounted and of a support layer supporting the surface layer, in which the surface layer entirely has lower volume resistivity than the support layer (Japanese Patent Laid-Open Publication No. 2002-134590).

In the ceramic heater, and in particular, in a ceramic heater in which the high frequency electrode is embedded in the ceramic base, when the plasma is generated at the time of heating, a part of plasma charges remains and is accumulated in the heating surface of the ceramic heater. Thus, when the heating object such as the wafer is detached from the heating surface, the accumulated charges may be discharged to the heating object. Such discharge is called arcing, which brings a damage of the wafer and a generation of particles.

Moreover, by the fact that a part of the plasma charges remains on the heating surface of the ceramic heater, the wafer or the like set on the heating surface of the ceramic heater is sucked to the surface of the heater by electrostatic force due to the remaining charges, causing difficulty in detaching the wafer or the like.

Furthermore, a ring-like member may be mounted on a periphery of the wafer set on the heating surface in order to prevent unintended etching on the ceramic base at the time of the plasma generation. The charges caused by the plasma may be accumulated in the ring-like member. Then, such arcing in which the charges are discharged to the other members or the heating object occurs at the time when certain amount of the charges are accumulated in the ring-like member, leading to a breakage of the heating object and the like and the generation of the particles.

In this connection, it is an object of the present invention to provide a heating device that suppresses the charges from remaining on the ceramic base and the ring-like member, thus making it possible to effectively prevent an occurrence of the arcing.

SUMMARY OF THE INVENTION

In order to achieve the foregoing object, a heating device of the present invention includes: an insulating ceramic base having a heating surface for heating a heating object; a high frequency electrode embedded in the insulating ceramic base in a vicinity of the heating surface; a heating body disposed in the insulating ceramic base more apart from the heating surface than the high frequency electrode is; and a low resistance ceramic member exposed to a part of the heating surface of the insulting ceramic base and connected to a conductive member provided in the insulating ceramic base, wherein the low resistant ceramic member has a common main component of ceramics to the insulating ceramic base, and the low resistance ceramic member has a equivalent thermal expansion coefficient of the insulating ceramic base.

According to the heating device of the present invention, the charges are effectively suppressed from remaining in the ceramic base and the ring-like member, thus making it possible to prevent the occurrence of the arcing.

BRIEF DESCRIPTION OF THE DRAWINGS

The above and further objects, features and advantages of the invention will more fully appear in the detailed description of embodiments of the invention, when the same is read in conjunction with the drawings, in which.

DETAILED DESCRIPTION OF THE EMBODIMENTS

A description will be made below of embodiments of a heating device of the present invention by using the drawings.

Figure 1:
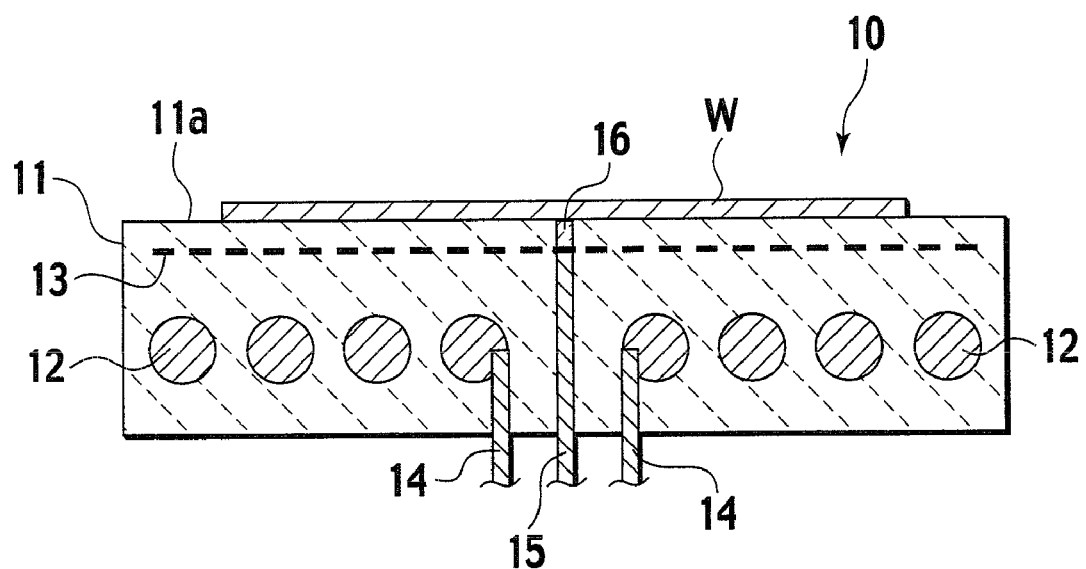
FIG. 1 is a cross-sectional view showing an embodiment according to a heating device of the present invention.

FIG. 1 is a cross-sectional view showing an embodiment according to the heating device of the present invention. In the drawings to be mentioned below, the respective composing elements of the heating device are drawn while varying dimensional ratios thereof from those of an actual heating device in order to facilitate understanding of the respective composing elements. Hence, the heating device according to the present invention is not limited to the dimensional ratios in the heating device shown in the drawings.

A heating device 10 of this embodiment shown in FIG. 1 has a disc-like ceramic base 11. The ceramic base 11 is made, for example, of aluminum nitride (AlN) ceramics. Moreover, the ceramic base 11 has high electrical resistivity or has insulating property, and specifically, has volume resistivity similar to volume resistivity inherent in usual ceramics, which is, for example, $10^8$ Ω·cm or more.

One of planar portions of the ceramic base 11 having a disc shape becomes a heating surface 11a for heating, for example, a wafer W as a heating object set thereon. A resistance heating body 12 is embedded in an inside of the ceramic base 11. Moreover, a high frequency electrode 13 is embedded between the resistance heating body 12 and the heating surface 11a of the ceramic base 11 and in the vicinity of the heating surface 11a. Electrode bars 14 and 15 are inserted from the other planar portion of the ceramic base 11 opposite the heating surface 11a and are joined to the resistance heating body 12 and the high frequency electrode, respectively, so as to connect to the resistance heating body 12 and the high frequency electrode 13, respectively. The resistance heating body 12 generates heat by receiving a supply of electric power from the electrode bars 14. Moreover, the high frequency electrode 13 generates plasma between the heating surface 11a and an opposite electrode (not shown) disposed above the heating surface 11a oppositely thereto by receiving a supply of electric power from the electrode bar 15.

A pin-like low resistance ceramic member 16 is disposed between the heating surface 11a of the ceramic base 11 and the high frequency electrode 13. In the low resistance ceramic member 16, one end of a pin shape thereof forms a flush surface with the heating surface 11a, and is exposed to the heating surface 11a. The other end is connected to the high frequency electrode 13. The low resistance ceramic member 16 is made, for example, of AlN ceramics of which electrical resistance is low by the fact that a conductive component is contained.

In the heating device 10 of this embodiment, as described above, the low resistance ceramic member 16 is provided, and the low resistance ceramic member 16 is exposed to a part of the heating surface 11a of the ceramic base 11, and is connected to the high frequency electrode 13 as a conductive member. The high frequency electrode 13 connected to the low resistance ceramic member 16 forms an electrical circuit together with an external power supply through the electrode bar 15. Hence, after a plasma treatment is implemented for the wafer W set on the heating surface 11a of the ceramic base 11, the heating device 10 of this embodiment can release charges accumulated in the heating surface 11a of the ceramic base 11 and the wafer W through the low resistance ceramic member 16 to the outside through the high frequency electrode 13 and the electrode bar 15. As a result, the charges accumulated in the heating surface 11a and the wafer W can be removed. Accordingly, the charges are not discharged to the heating object, an occurrence of arcing can be effectively prevented, and eventually, a damage of the wafer and a generation of particles can be prevented. Moreover, a phenomenon that the wafer W is sucked to the heating surface 11a by the charges accumulated in the heating surface 11a is solved.

Note that, in Japanese Patent Laid-Open Publication No. 2002-134590 mentioned above, it is described that a surface layer of which volume resistivity is relatively low is provided on a ceramic susceptor, thus making it possible to prevent mislocation of a treatment object, which is caused by a phenomenon that the treatment object is sucked to a mounting surface of a susceptor. However, according to the technology described in Japanese Patent Laid-Open Publication No. 2002-134590, even if the mislocation of the treatment object can be merely prevented, such a suction phenomenon itself for the treatment object cannot be solved effectively.

A material of the low resistance ceramic member 16 is a material having lower electrical resistivity than the ceramic base 11, that is, having conductivity. Low resistance aluminum nitride (AlN) ceramics can be applied to the low resistance ceramic member 16. A component composition of the low resistance aluminum nitride ceramics is not particularly limited. For example, aluminum nitride containing carbon fiber as a conductive component, which is as disclosed in Japanese Patent Laid-Open Publication No. 2005-41765 mentioned above, can be used. Moreover, aluminum nitride containing an oxide of a rare earth element, such as yttrium oxide, cerium oxide, and samarium oxide, which is heretofore known as the low resistance aluminum nitride ceramics, can also be used. It is necessary that the volume resistivity of the low resistance ceramic member 16 is lower than the volume resistivity of the ceramic base 11 and enables to move the charges remaining in the heating surface 11a. From a viewpoint of obtaining good conductivity, a ceramic member with volume resistivity, for example, from 10 Ω·cm or more to less than 10000 Ω·cm can be used for the low resistance ceramic member 16. As a material having the volume resistivity within a numeric range as described above, for example, there is a low resistance aluminum nitride ceramic material disclosed in Japanese Patent Laid-Open Publication No. 2005-41765 mentioned above. Hence, in the present invention, the low resistance aluminum nitride ceramic material disclosed in Japanese Patent Laid-Open Publication No. 2005-41765 can be suitably applied.

From a viewpoint of removing the charges remaining in the heating surface 11a, instead of the low resistance ceramic member 16 according to this embodiment, it is also considered to use a metal material having conductivity, as a member that connects the heating surface 11a of the ceramic base 11 and the high frequency electrode 13 to each other. However, in the case of using the metal material instead of the low resistance ceramic member 16, there is an apprehension that the metal material may be corroded by a corrosive atmosphere in a usage environment, resulting in contamination of the wafer W. As opposed to this, in the heating device 10 according to the present invention, which uses the low resistance ceramic member 16, the contamination of the wafer W does not occur. Here, the heating device 10 according to the present invention is advantageous.

In the above-described heating device 10 of this embodiment, the ceramic base 11 is made of the aluminum nitride ceramics, and the low resistance ceramic member 16 is made of the low resistance aluminum nitride ceramics. Specifically, both the ceramic base 11 and the low resistance ceramic member 16 are made of ceramics containing the aluminum nitride as a main component. To the low resistance ceramic member 16, it is possible to apply low resistance or conductive ceramics made of a main component different from that of the ceramic base 11. However, in the case of using, as the low resistance ceramic member 16, the low resistance or conductive ceramics made of the main component different from that of the ceramic base 11, there is an apprehension that an internal stress may remain in the inside of the ceramic base 11 owing to a difference in thermal expansion coefficient between the low resistance ceramic member 16 and the ceramic base 11.

As opposed to this, when the low resistance ceramic member 16 is made of the ceramics of which main component is common to that of the ceramic base 11, thermal expansion coefficients of both are equivalent to each other. Even if there is a difference between the thermal expansion coefficients, the difference is slight. Therefore, the internal stress hardly occurs, and as a result, excellent durability is offered. Moreover, the low resistance ceramic member 16 has hardly a difference also in thermal conductivity from that of the ceramic base 11. It is possible to efficiently remove the charges in the heating surface 11a without damaging uniform heating performance of the ceramic base 11. Hence, it is more suitable that the low resistance ceramic member 16 be made of ceramics of which main component is common to that of the ceramic base 11.

In particular, in the case of using the aluminum nitride (AlN) for the base 11, when AlN of which resistance is reduced by containing the carbon fiber, which is shown in Japanese Patent Laid-Open Publication No. 2005-41765 mentioned above, is applied to the low resistance ceramic member 16, an extremely suitable result can be obtained, and this is extremely advantageous in terms of manufacture. Specifically, the low resistance ceramic member 16 and the ceramic base 11 as a matrix joined thereto are made of the same type of ceramics, and accordingly, both are completely coupled to each other in a diffusion manner on an interface therebetween at the time of sintering, and then are adhered to each other. In addition, both are equivalent to each other also in sintering shrinkage and thermal shrinkage after the sintering, and accordingly, the internal stress hardly occurs. Hence, it becomes possible to offer sufficient strength and durability in terms of practical use.

An area of the low resistance ceramic member 16, which is exposed to the heating surface 11a, is sufficient if the area is to an extent where the low resistance ceramic member 16 can contact the wafer W in a state where the wafer W is set on the heating surface 11a. When such an exposed area of the low resistance ceramic member 16 to the heating surface 11a is too large, there are apprehensions that a plasma distribution of a plasma atmosphere formed by using the high frequency electrode 13 may become nonuniform, and that a plasma state may be destabilized. Hence, though depending on a dimension and shape of the heating device 10, preferably, the exposed area of the low resistance ceramic member 16 to the heating surface 11a is an area corresponding to a circle with a diameter of a few millimeters.

An exposed position of the low resistance ceramic member 16 to the heating surface 11a can be set at a position opposite to the wafer W set on the heating surface 11a. No more limitations are imposed on the position if the position is within such a range as opposite to the wafer W. In the example illustrated in FIG. 1, the low resistance ceramic member 16 is disposed in the vicinity of the center of the heating surface 11a.

In the embodiment shown in FIG. 1, an object to which the low resistance ceramic member 16 is electrically connected is the high frequency electrode 13. The high frequency electrode 13 is embedded in the vicinity of the heating surface 11a. Accordingly, if the high frequency electrode 13 is applied as a conductive member connected to the low resistance ceramic member 16, wiring thereof with the low resistance ceramic member 16 is easy, and hence, this is advantage in removing the charges remaining in the heating surface 11a. However, the conductive material is not limited to the high frequency electrode 13.

Figure 2:
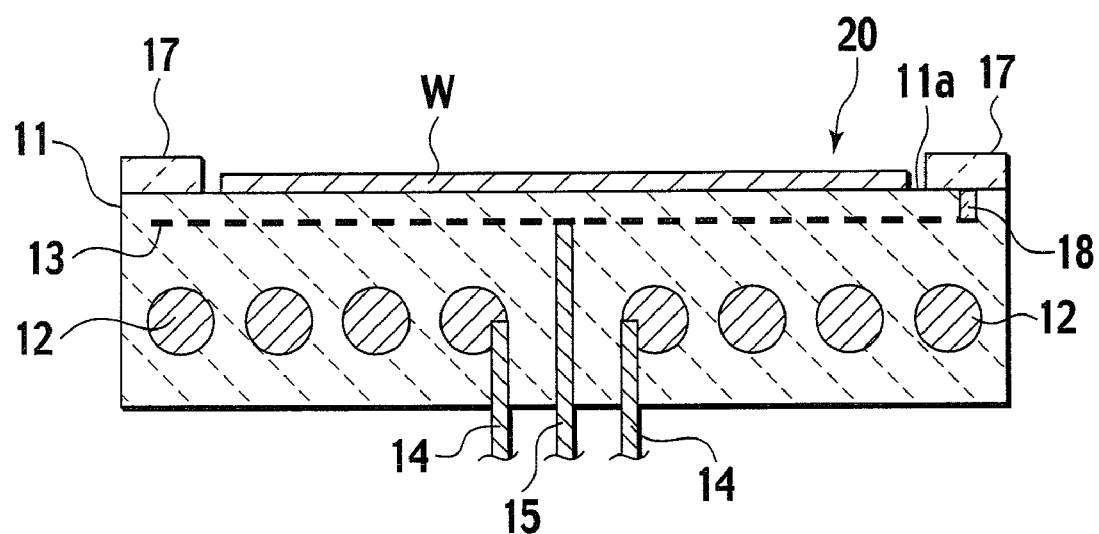
FIG. 2 is a cross-sectional view showing another embodiment according to the heating device of the present invention.

FIG. 2 is a cross-sectional view explaining a heating device 20 of another embodiment of the present invention. Note that, in FIG. 2, the same reference numerals are assigned to the same members as those in FIG. 1, and a duplicate description is omitted below.

In the heating device 20 of this embodiment shown in FIG. 2, a ring-like member 17 is mounted on a heating surface 11a of a ceramic base 11 and in the periphery of the wafer W. The ring-like member 17 is made of Si, Al, SiO$_2$, or the like, and is used for preventing the corrosion of the ceramic base 11, controlling a gas flow, and fixing a position of the wafer.

At a position between the heating surface 11a of the ceramic base 11 and a high frequency electrode 13 embedded in the ceramic base 11 and opposite to the ring-like member 17, a pin-like low resistance ceramic member 18 is disposed. The low resistance ceramic member 18 is made, for example, of low resistance AlN ceramics. In comparison with the low resistance ceramic member 16 shown in FIG. 1, the above-described low resistance ceramic member 18 is different therefrom only in a disposed position in the ceramic base 11, and other constructions of the low resistance ceramic member 18 can be made similar to those of the low resistance ceramic member 16.

In the heating device 20 of this embodiment shown in FIG. 2, the low resistance ceramic member 18 exposed to the heating surface 11a contacts the ring-like member 17, and becomes conductible to the ring-like member 17. In addition, the low resistance ceramic member 18 is electrically connected to the high frequency electrode 13 as a conductive member. Hence, the low resistance ceramic member 18 can release the charges accumulated in the ring-like member 17 to the outside through the high frequency electrode 13. As a result, the charges accumulated in the ring-like member 17 are removed. Hence, the arcing caused by the charges accumulated in the ring-like member 17 can be effectively prevented, and eventually, the damage of the wafer W and the generation of the particles can be prevented.

Figure 3:
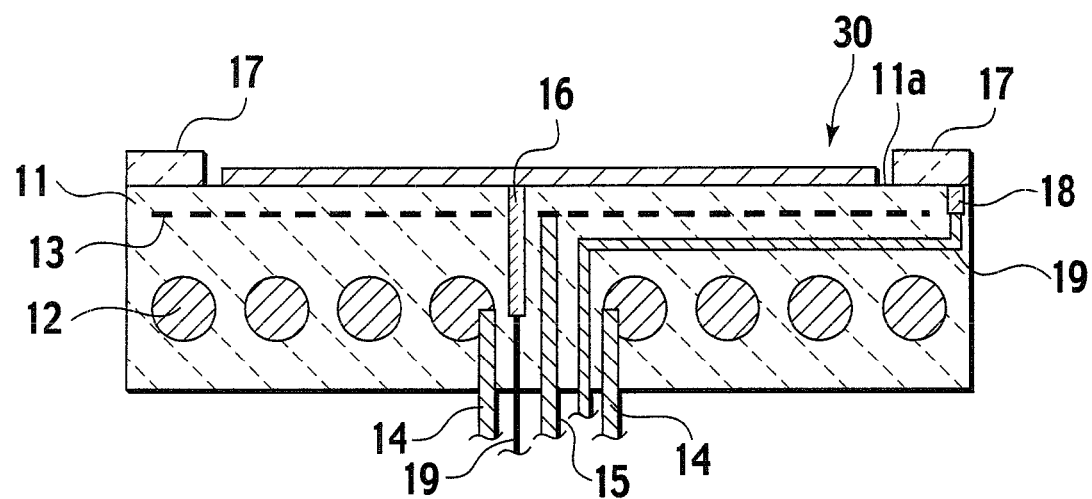
FIG. 3 is a cross-sectional view showing another embodiment according to the heating device of the present invention.

FIG. 3 is a cross-sectional view showing a heating device 30 of another embodiment of the present invention. Note that, in FIG. 3, the same reference numerals are assigned to the same members as those in FIG. 1 and FIG. 2, and a duplicate description is omitted below.

In the heating device 30 of this embodiment shown in FIG. 3, in the inside of the ceramic base 11, a low resistance ceramic member 16 is disposed at a position opposite to the wafer W, and in addition, a low resistance ceramic member 18 is disposed at a position opposite to the ring-like member 17. Between the low resistance ceramic member 16 and the low resistance ceramic member 18, the former low resistance ceramic member 16 has the same construction as that of the low resistance ceramic member 16 shown in FIG. 1. Moreover, the latter low resistance ceramic member 18 is different from the heating device 20 of the embodiment shown in FIG. 2 in being connected to an electrical wire 19 provided separately from the high frequency electrode 13 in the inside of the ceramic base 11, and except this point, the low resistance ceramic member 18 of this embodiment has the same construction as that of the low resistance ceramic member 18 of the embodiment shown in FIG. 2.

As shown in FIG. 3, in the heating device 30 in which the electrical wire 19 is provided separately in the inside of the ceramic base 11, wiring becomes complicated in comparison with the heating devices 10 and 20 shown in FIG. 1 and FIG. 2. However, when the ring-like member 17 is made of the low resistance material such as Si or the conductive material, and the low resistance ceramic member 18 in contact with the ring-like member 17 is connected to the high frequency electrode 13, it becomes difficult to uniform the plasma distribution of the plasma atmosphere formed by using the high frequency electrode 13. Hence, when the ring-like member 17 is made of the above-described Si or the like, as in this embodiment shown in FIG. 3, it is preferable to connect the low resistance ceramic member 18 to the electrical wire 19 provided separately from the high frequency electrode 13 because, by such connection, the plasma distribution can be uniformed easily.

According to the heating device 30 of this embodiment shown in FIG. 3, the remaining charges in the wafer W can be removed by the low resistance ceramic member 16. In addition, the charges accumulated in the ring-like member 17 can be removed by the low resistance ceramic member 18. Hence, the arcing caused by the charges accumulated in the heating surface 11a and the ring-like member 17 after the plasma treatment can be effectively prevented. Moreover, the phenomenon that the wafer W is sucked to the heating surface 11a by the charges accumulated in the heating surface 11a is solved.

Figure 4:
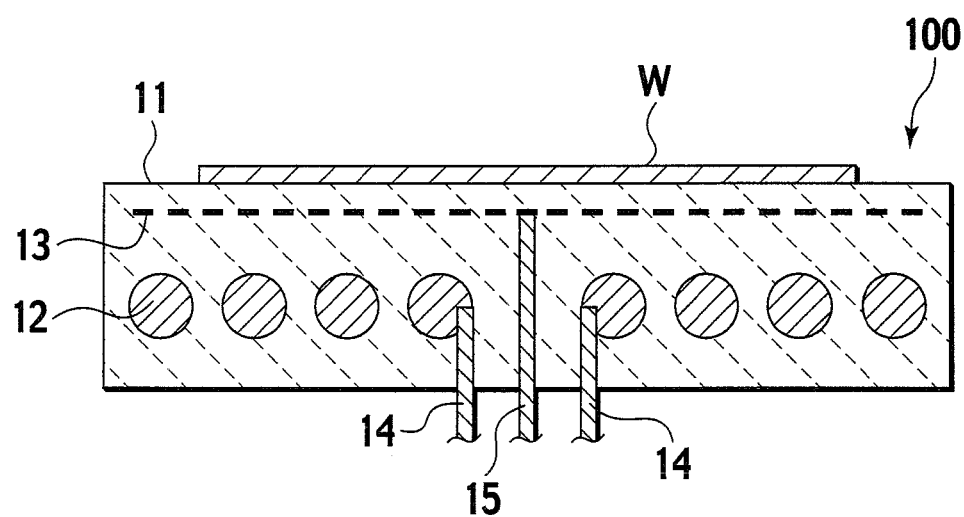
FIG. 4 is a cross-sectional view of an example of a conventional heating device.

FIG. 4 is a cross-sectional view of an example of a conventional heating device 100 shown for comparison. In the conventional heating device 100 shown in FIG. 4, the low resistance ceramic member 16 and the low resistance ceramic member 18 disposed in the heating devices according to the present invention are not disposed in a ceramic base 11. In the conventional heating device 100 as described above, it is already described that the arcing is sometimes caused by the charges accumulated in the wafer W after the plasma treatment, and that the suction phenomenon sometimes occurs.

Next, a description will be made of an example of a manufacturing method of the heating device of the present invention.

First, ceramic powder as a source material of the ceramic base 11 and ceramic power for the low resistance ceramic member 16 or the low resistance ceramic member 18 are individually prepared.

The ceramic powder as the source material of the ceramic base 11 is prepared, for example, in the following manner. Aluminum nitride powder obtained by a publicly known manufacturing method such as a reduction/nitridation method, a gas phase synthesis method, and a direct nitridation method is mixed with a rare earth oxide such as yttrium oxide, or nitrate, sulfate, oxalate, chloride, or alkoxide as a source compound of the rare earth oxide, which is to be added in response to desired volume resistivity, in a predetermined mixing ratio. Then, a solvent such as isopropyl alcohol is added to a resultant mixture, and the mixture is pulverized and mixed by using a mixer/pulverizer such as a pot mill, a trommel, and an attrition mill. Both of a wet mode and a dry mode may be used for the pulverization and the mixing. In the case of using the wet mode, the mixture is dried by using a spray dry method or the like after the mixing, and mixture powder of the source material is thereby obtained. Moreover, desirably, vacuum drying is implemented for the mixture powder, and thereafter, the powder thus dried is screened to adjust a grain size thereof.

The ceramic powder for the low resistance ceramic member 16 or the low resistance ceramic member 18 is prepared, for example, in the following manner. The aluminum nitride powder as the source material, the carbon fiber, and preferably, the rare earth oxide such as yttrium oxide are mixed together in a predetermined mixing ratio, the solvent such as isopropyl alcohol is added to a resultant mixture, and the mixture is pulverized and further mixed by using the mixer/pulverizer such as the pot mill, the trommel, and the attrition mill. Even if the rare earth oxide is used as the conductive component added to the aluminum nitride powder as the source material, it is possible to realize the low resistance ceramic members 16 and 18. Rather than this case (use of the rare earth oxide), low resistance ceramic members added with the carbon fiber are more advantageous. This is because, in the case of using the carbon fiber, it is easy to form a conduction path in a sintered body, and hence, low volume resistivity can be obtained while maintaining the characteristics inherent in the aluminum nitride.

As the carbon fiber, for example, carbon fiber with a fiber diameter of 1 μm or less and an aspect ratio of 5 or more, preferably, 10 or more can be used. A carbon nanotube can also be used.

An additive amount of the carbon fiber to the aluminum nitride powder as the source material just needs to be determined in response to electrical characteristics and physical property, which are necessary for the usage purpose of the sintered body obtained finally. For example, when volume resistivity of approximately $10^{12}$ Ω·cm or less is desired to be obtained while maintaining physical property of the low resistance ceramic member 16 or 18, which is equivalent to that of the ceramic base 11, the additive amount of the carbon fiber is set at, preferably, 5 parts by weight or less, more preferably, 1 part by weight or less with respect to 100 parts by weight of the aluminum nitride powder as the source material. Moreover, when volume resistivity of approximately $10^4$ Ω·cm or less, which is lower than the above-described one, is desired to be obtained while maintaining favorable strength, heat resistance and corrosion resistance of the low resistance ceramic member 16 or 18, the additive amount of the carbon fiber is set at, preferably, 20 parts by weight or less, more preferably, 10 parts by weight or less with respect to 100 parts by weight of the aluminum nitride powder as the source material.

Moreover, in the case of adding the rare earth oxide, a mixing ratio thereof is set at, preferably, 0.2 parts by weight or more and 20 parts by weight or less, more preferably, 10 parts by weight or less with respect to 100 parts by weight of the aluminum nitride powder as the source material.

Both of the wet mode and the dry mode may be used for the agitation and the mixing. In the case of using the wet mode, the mixture is dried by using the spray dry method or the like after the mixing, and mixture powder of the source material is thereby obtained. Moreover, desirably, the vacuum drying is implemented for the mixture powder, and thereafter, the powder thus dried is screened to adjust the grain size thereof. Note that, to the mixture powder of the source material, a binder component such as polyvinyl alcohol can be added. When the binder is added, it is necessary to pay attention not to oxidize and lose the carbon fiber by performing a degreasing step that follows in an inert atmosphere of nitrogen or the like.

Next, in the event of manufacturing the ceramic base 11, the pin-like low resistance ceramic members 16 and 18 are fabricated in advance. The low resistance ceramic members 16 and 18 are fabricated in such a manner that the ceramic powder as the source material for the low resistance ceramic members 16 and 18, which is prepared as described above, is pressure-formed into pin shapes. More preferably, a compacted body obtained by the pressure molding is sintered to form pin-like sintered bodies. Specifically, the low resistance ceramic members 16 and 18 may be unsintered compacted bodies or sintered bodies as long as the shapes thereof can be surely maintained in the manufacturing process of the ceramic base 11. However, the sintered bodies have higher strength than the compacted bodies, and can maintain the pin shape more surely. Accordingly, the sintered bodies are more preferable. In this case, a density of each sintered body, which is closer to a density of each compacted body, is more preferable since the sintering shrinkage can be made more easily in the case of such a density.

For the pressure molding for the low resistance ceramic members 16 and 18, a metal die molding method may be used, or CIP may be used. Such publicly known methods for compacting the ceramic powder into the pin shape can be used. Moreover, for the sintering for the compacted bodies of the low resistance ceramic members 16 and 18, such publicly known sintering methods as a hot press method, a pressureless sintering method, and HIP can be used. Desirably, at this time, the atmosphere when the compacted bodies are heated and sintered is set at a vacuum, inert or reducing atmosphere, so that the carbon fiber contained in the low resistance ceramic members 16 and 18 cannot be oxidized or burned off. Moreover, though depending on an amount of sintering aids, preferably, a sintering temperature is set at 1650° C. to 2200° C.

In each aluminum nitride sintered body obtained after sintering, the carbon fiber remains in a dispersed state into grain boundaries and grains while substantially maintaining a fiber structure in an initial state of the carbon fiber concerned (when the carbon fiber is still raw). Then, each carbon fiber contacts the other adjacent ones in the aluminum nitride sintered body, and continuous three-dimensional conduction paths are thereby formed.

Next, the ceramic base 11 is fabricated. The example of the ceramic base 11 embeds and includes therein the resistance heating body 12 and the high frequency electrode 13. Therefore, in an example of the manufacturing method, a partial compacted body obtained by dividing the ceramic base 11 in the thickness direction is fabricated, the high frequency electrode 13 as the conductive member, the ceramic powder as the source material for the ceramic base 11, the resistance heating body 12, and the ceramic powder as the source material for the ceramic base 11 are sequentially stacked on the compacted body thus fabricated, followed by the pressure molding, a compacted body thus obtained is finally sintered, and a sintered body of the ceramic base 11 can be thereby obtained.

In the process of fabricating the ceramic base 11, the above-described partial compacted body in which the high frequency electrode 13 and the like are stacked is a compacted body including a portion serving as the heating surface of the ceramic base 11 among the portions obtained by dividing the ceramic base 11 in the thickness direction. The partial compacted body can be compacted by uniaxial pressure molding by means of a metal die.

The compacted bodies or sintered bodies of the above-described low resistance ceramic members 16 and 18 are embedded into predetermined positions of the partial compacted body. Such embedding can be performed, for example, in such a manner that the sintered bodies of the pin-like low resistance ceramic members 16 and 18 are disposed at predetermined positions of the metal die, the ceramic powder as the source material of the ceramic base 11 is subsequently charged into the metal die, and then the sintered bodies of the low resistance ceramic members 16 and 18 are subjected to the uniaxial pressure molding together with the ceramic powder as the source material. Alternatively, the embedding can be performed in such a manner that holes are drilled in a surface of the partial compacted body, and the sintered bodies of the pin-like low resistance ceramic members 16 and 18 are mechanically forced into the holes in the thickness direction.

Note that high melting point metal bulk bodies made of Mo, W, an alloy thereof, or the like are embedded together with the low resistance ceramic members into portions in the partial compacted body, where the low resistance ceramic members and the conductive member are coupled to each other after the sintering. Then, it becomes easy to ensure the conduction between the low resistance ceramic members and the conductive member, and accordingly, the above-described embodiment of the high melting point metal bulk bodies is more preferable. Alternatively, at the time when the low resistance ceramic members are compacted, bulk bodies made of Mo or the like may be embedded into ends of the low resistance ceramic members. When a diameter of the embedded bulk bodies is set at 3 mm or less, and a height thereof is set at 2 mm or less, the shrinkage of the ceramic powder at the time of the sintering is not inhibited, and accordingly, such a dimensional setting is more preferable.

Next, the high frequency electrode 13 is mounted on one of surfaces of the above-described partial compacted body into which the low resistance ceramic members 16 and 18 are embedded. As the high frequency electrode, there can be used a sheet electrode having a perforated pattern, which is formed of a bulk body of metal such as Mo and W, more preferably, a mesh-like (wire netting) electrode.

On the high frequency electrode 13, the ceramic powder as the source material of the ceramic base 11 is placed by an amount necessary to form a predetermined thickness, followed by another uniaxial pressure molding, and further, the resistance heating body 12 is mounted on the placed ceramic powder. For the resistance heating body 12, there can be used high melting point metal such as Mo and W, which is formed into a metal bulk body processed into a predetermined shape such as a coil shape and a spiral shape.

After mounting the resistance heating body 12, the ceramic powder as the source material of the ceramic base 11 is further placed thereon by an amount necessary to form a predetermined thickness, and another uniaxial pressure molding is performed In such a way, the compacted body of the ceramic base 11 is obtained.

The obtained compacted body of the ceramic base 11 is heated and sintered by using the hot press method, the pressureless sintering method, or the like, and the sintered body is thereby fabricated. In this sintering, the hot press method can be used. In the hot press method, uniaxial pressurization is performed at the time of the sintering, and accordingly, the adhesion between the high frequency electrode and the aluminum nitride sintered body can be made more preferable. Therefore, the hot press method is advantageous.

Though depending on the amount of sintering aids, and the like, preferably, the sintering temperature is set at 1650° C. to 2200° C. Desirably, the atmosphere at this time of the sintering is set at the vacuum, inert or reducing atmosphere.

After the sintered body of the ceramic base 11 is fabricated, the sintered body can be processed into a desired shape, or surface roughness of the heating surface can be adjusted.

EXAMPLE

Example 1

Aluminum nitride powder containing $Y_2O_3$ of 5 wt % was charged into a metal die with a diameter of $\phi$355 mm so that a thickness of a sintered body of the aluminum nitride powder, which is obtained later, could be 2 mm, and the aluminum nitride powder was compacted into a disc shape by uniaxial pressure molding. Moreover, a column-shaped sintered body that was made of low resistance AlN (containing carbon fiber of 1 wt % and $Y_2O_3$ of 2 wt %) and fabricated to have a diameter of $\phi$2 mm and an axial length of 3 mm was fabricated in advance. In the column-shaped sintered body, volume resistivity of the column-shaped sintered body was 10 $\Omega$·cm, a porosity was 12%, and a thermal expansion coefficient was 5.6 ppm/K. A hole was drilled in the center of the above-described disc-like compacted body, and the column-shaped sintered body was embedded into the hole. At this time, the low resistance AlN protruded from the compacted body by approximately 0.3 mm. This column-shaped sintered body of the low resistance AlN becomes the low resistance ceramic member 16.

Next, a Mo mesh with a diameter of $\phi$340 mm, which becomes the high frequency electrode, was placed on the compacted body. Next, the aluminum nitride powder containing $Y_2O_3$ of 5 wt % was charged onto the Mo mesh so that a thickness thereof after sintering could be 5 mm, followed by another uniaxial pressure molding. Further, a resistance heating body formed of a Mo coil was disposed in the metal die, and from the above of the resistance heating body, the aluminum nitride powder containing $Y_2O_3$ of 5 wt % was charged into the metal die, followed by uniaxial molding. In such a way, a compacted body was obtained.

The compacted body was sintered at 1900° C. in a nitrogen inert atmosphere in a hot press furnace.

In a heater plate obtained by the sintering, the low resistance ceramic member and the ceramic base were adhered to each other without an interface, and a porosity thereof was 0.5% or less. Note that a thermal expansion coefficient of the heater plate was 5.7 ppm/K. Countersunk holes were drilled in the sintered body so that two ends of the resistance heating body and the high frequency electrode could be exposed from the 5 wt % $Y_2O_3$-containing aluminum nitride side of the obtained heater plate. Thereafter, Ni-made conductive bars were individually joined to the resistance heating body and the high frequency electrode through Kovar and gold brazing.

Comparative Example 1

Meanwhile, a ceramic base was fabricated without disposing the column-shaped low resistance ceramic member 16 made of the low resistance AlN. Then, in a similar way to Example 1 except this point, a heater plate was fabricated, in which the entirety was made of the aluminum nitride containing $Y_2O_3$ of 5 wt %.

Silicon wafers were mounted on the respective heater plates of Example 1 and Comparative example 1, which were obtained as described above. Voltages were applied to heating elements to raise temperatures thereof, high frequency voltages were applied to high frequency electrode terminals, and the heater plates were left for one minute. Then, after the high frequency electrode terminals were grounded, electroscope probes were made to approach surfaces of the silicon wafers. As a result, while nothing occurred in Example 1, in Comparative example 1, arc flied to the electroscope probe, and charges accumulated in the silicon wafer were discharged. Note that the electroscope probes were grounded through an ammeter Moreover, in the heater plate of Example 1, when a lift pin disposed in the heating device was elevated to lift up the silicon wafer mounted on the heating surface of the ceramic base, the silicon wafer was able to be easily detached from the heating surface without being sucked thereto.

Example 2

Aluminum nitride powder containing $Y_2O_3$ of 5 wt % was charged into a metal die with a diameter of $\Phi$355 mm so that a thickness of a sintered body of the aluminum nitride powder, which is obtained later, could be 2 mm, and the aluminum nitride powder was compacted into a disc shape by uniaxial pressure molding. A hole was drilled at a position with a pitch circle diameter (PCD) of 165 mm in the compacted body thus obtained, and a low resistance AlN sintered body was embedded into the hole. The low resistance AlN sintered body becomes the low resistance ceramic member 18 after sintering to be described later.

Next, a Mo mesh with a diameter of $\phi$340 mm, which becomes the high frequency electrode, was placed on the compacted body. Next, the aluminum nitride powder containing $Y_2O_3$ of 5 wt % was charged onto the Mo mesh so that a thickness thereof after the sintering could be 5 mm, followed by another uniaxial pressure molding. Further, a resistance heating body formed of a Mo coil was disposed in the metal die, and from the above of the resistance heating body, the aluminum nitride powder containing $Y_2O_3$ of 5 wt % was charged into the metal die, followed by uniaxial molding. In such a way, a compacted body was obtained.

The compacted body was sintered at 1900° C. in a nitrogen inert atmosphere in a hot press furnace. An outer circumferential portion of a sintered body thus obtained was cut out by 5 mm, and a heater plate with a diameter of $\phi$350 mm was fabricated. Countersunk hole were drilled in the sintered body so that two ends of the resistance heating body and the high frequency electrode could be exposed from the 5 wt % $Y_2O_3$-containing aluminum nitride side of the obtained heater plate. Thereafter, Ni-made conductive bars were joined to the exposed heating body and high frequency electrode through Kovar and gold brazing.

Comparative Example 2

Meanwhile, a ceramic base was fabricated without disposing the column-shaped low resistance ceramic member 18 made of the low resistance AlN. Then, in a similar way to Example 2 except this point, a heater plate was fabricated, in which the entirety was made of the aluminum nitride containing $Y_2O_3$ of 5 wt %.

$SiO_2$-made rings with an outer diameter of $\phi$350 mm and an inner diameter of $\phi$300.5 mm were mounted on these heater plates of Example 2 and Comparative example 2. Voltages were applied to resistance heating bodies to raise temperatures thereof, high frequency voltages were applied to high frequency electrode terminals, and the heater plates were left for one minute. Then, after the high frequency electrode terminals were grounded, electroscope probes were made to approach surfaces of the $SiO_2$-made rings. As a result, while nothing occurred in Example 2, in Comparative example 2, arc flied to the electroscope probe, and charges accumulated in the SiO$_2$-made rings were discharged. Note that the electroscope probes were grounded through an ammeter.

While preferred embodiments of the present invention have been described using specific terms, such description is for illustrate purposes, and it is to be understood that changes and variations may be made without departing from the spirit or scope of the claims.

What is claimed is:

1. A heating device, comprising:
   an electrically insulating ceramic base having a heating surface for heating an object on the heating surface;
   a high frequency electrode embedded in the electrically insulating ceramic base proximate the heating surface;
   a heating body disposed in the electrically insulating ceramic base in a location that is spaced further apart from the heating surface than a location of the high frequency electrode; and
   at least one electrically conductive ceramic member exposed to a part of the heating surface of the insulting ceramic base and connected to an electrically conductive member provided in the insulating ceramic base, the at least one electrically conductive ceramic member comprising a first electrically conductive ceramic member provided to contact the object on the heating surface of the insulating ceramic base and a second electrically conductive ceramic member provided to contact a member mounted on the heating surface;
   wherein the first electrically conductive member is connected to the high frequency electrode; and
   wherein the second electrically conductive ceramic member is connected to an electrical wire embedded in the electrically insulating ceramic base separately from the high frequency electrode, and the electrical wire is connected to an external power supply;
   wherein the electrically conductive ceramic member has a main ceramic component that is common to the insulating ceramic base; and
   wherein the electrically conductive ceramic member has a thermal expansion coefficient that is equivalent to a thermal expansion coefficient of the electrically insulating ceramic base.

2. The heating device according to claim 1, wherein the at least one electrically conductive ceramic member comprises carbon fiber in the ceramic component that is common to the electrically insulating ceramic base.

3. The heating device according to claim 1, wherein the electrically insulating ceramic base and the at least one electrically conductive ceramic member are both made of an AlN ceramic.

4. The heating device according to claim 1, wherein the at one electrically conductive ceramic member is connected to the high frequency electrode.

5. The heating device according to claim 1, wherein an exposed portion of the at least one electrically conductive ceramic member contacts at least one of the object on the heating surface and a member mounted on the heating surface.

* * * * *